(12) United States Patent
Cullins

(10) Patent No.: US 12,013,633 B2
(45) Date of Patent: Jun. 18, 2024

(54) PHOTOMASK CLEANING

(71) Applicant: Applied Materials, Inc., Santa Clara, CA (US)

(72) Inventor: Jerry Cullins, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 313 days.

(21) Appl. No.: 17/260,468

(22) PCT Filed: Aug. 28, 2019

(86) PCT No.: PCT/US2019/048646
§ 371 (c)(1),
(2) Date: Jan. 14, 2021

(87) PCT Pub. No.: WO2020/076431
PCT Pub. Date: Apr. 16, 2020

(65) Prior Publication Data
US 2021/0302827 A1 Sep. 30, 2021

Related U.S. Application Data

(60) Provisional application No. 62/744,306, filed on Oct. 11, 2018.

(51) Int. Cl.
*G03F 1/82* (2012.01)
*G03F 1/62* (2012.01)

(52) U.S. Cl.
CPC . *G03F 1/82* (2013.01); *G03F 1/62* (2013.01)

(58) Field of Classification Search
CPC ..................................... G03F 1/82; G03F 1/62
See application file for complete search history.

(56) References Cited

U.S. PATENT DOCUMENTS

| | | | | |
|---|---|---|---|---|
| 5,258,320 A | * | 11/1993 | Zavracky | ............ H01L 27/1214 |
| | | | | 348/E5.145 |
| 6,081,249 A | * | 6/2000 | Harris | .................. G09G 3/3433 |
| | | | | 359/230 |
| 9,835,940 B2 | * | 12/2017 | Tseng | ........................ G03F 1/64 |

(Continued)

FOREIGN PATENT DOCUMENTS

| | | | | |
|---|---|---|---|---|
| EP | 3391151 B1 | * | 2/2022 | ............... G03F 1/62 |
| JP | 2018-132669 A | | 8/2018 | |

(Continued)

OTHER PUBLICATIONS

JP_2018132669_A_I English Translation (Year: 2018).*

(Continued)

*Primary Examiner* — Mark F. Huff
*Assistant Examiner* — Moriah S. Smoot
(74) *Attorney, Agent, or Firm* — Patterson + Sheridan, LLP

(57) ABSTRACT

Generally, examples described herein relate to methods and apparatus for photomask processing. In an example, a photomask is obtained that is protected by a pellicle during a photolithography process. The photomask is cleaned by performing an etch process on the photomask using an etchant that is selective to etch a first material of the pellicle at a greater rate than each material of the photomask. In some examples, the pellicle includes a rigid material through which radiation is transmitted during the photolithography process.

20 Claims, 3 Drawing Sheets

(56) References Cited

U.S. PATENT DOCUMENTS

| | | | |
|---|---|---|---|
| 2003/0039894 A1* | 2/2003 | Yan | B82Y 40/00 |
| | | | 430/323 |
| 2004/0233535 A1* | 11/2004 | Quesnel | G21K 1/062 |
| | | | 359/586 |
| 2011/0203611 A1 | 8/2011 | Uemura et al. | |
| 2013/0186436 A1 | 7/2013 | Jeong et al. | |
| 2018/0059534 A1* | 3/2018 | Tu | C23C 16/56 |

FOREIGN PATENT DOCUMENTS

| | | | | |
|---|---|---|---|---|
| JP | 2018132669 A * | 8/2018 | | |
| WO | 2017-102380 A1 | 6/2017 | | |
| WO | WO-2017102380 A1 * | 6/2017 | | G03F 1/22 |

OTHER PUBLICATIONS

Li, Li, et al. "A new soft lithographic route for the facile fabrication of hydrophilic sandwich microchips." Electrophoresis 33.16 (2012) : 2591-2597. (Year: 2012).*

International Search Report and Written Opinion dated Dec. 9, 2019, PCT/US2019/048646.

* cited by examiner

PHOTOMASK CLEANING

BACKGROUND

Field

Examples described herein generally relate to the field of semiconductor manufacturing, and more specifically, methods and apparatus for cleaning a photomask used in photolithography.

Description of the Related Art

During photolithography, a photomask is used to transfer a pattern to a photoresist disposed on a substrate. Particles that enter a focal plane of the photomask or become disposed on the photomask may damage the photomask. The particles may also be imaged and transferred as part of the pattern, which can result in a defocused or suboptimal exposure of the photomask. A pellicle is often attached to the photomask to prevent particles from damaging and contaminating the photomask.

SUMMARY

An example is a method for photomask processing. A photomask is obtained that is protected by a pellicle during a photolithography process. The photomask is cleaned by performing an etch process on the photomask using an etchant that is selective to etch a first material of the pellicle at a greater rate than each material of the photomask.

Another example is a method of photomask processing. A photomask is obtained, where the photomask is protected by a pellicle during a photolithography process. The pellicle includes a rigid material through which radiation is transmitted during the photolithography process. The photomask is exposed to an etchant. The etchant is selective to etch the rigid material of the pellicle at a greater rate than each material of the photomask.

A yet further example is a method of photomask processing. A photomask is exposed to a wet etchant. The photomask is used during a photolithography process, and the photomask is protected by a pellicle during the photolithography process. The photomask includes one or more layers of amorphous silicon. The pellicle includes polycrystalline silicon through which radiation is transmitted during the photolithography process. The wet etchant selectively etches a crystalline plane of silicon.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

To facilitate understanding, identical reference numerals have been used, wherever possible, to designate identical elements that are common to the figures.

DETAILED DESCRIPTION

Figure 1:
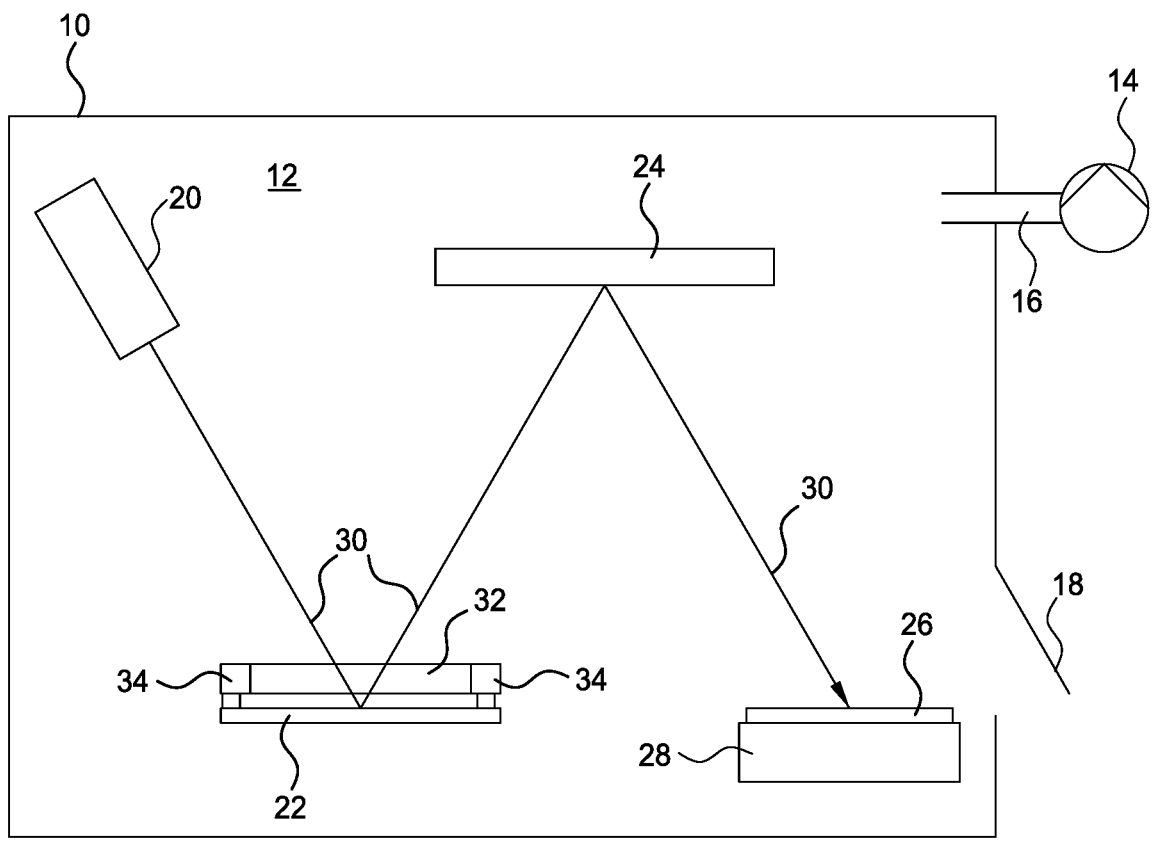
FIG. 1 is a simplified lithography chamber according to some examples of the present disclosure.

Generally, examples described herein relate to methods and apparatus for processing using a photomask and/or processing performed on a photomask. In photolithography (or "lithography" as interchangeably used herein), photomasks are used to create a pattern of radiation that is then incident on a photosensitive material (e.g., a photoresist). In some lithography processes, radiation is reflected off of the photomask to form the patterned radiation, while in other lithography processes, radiation passes through the photomask to form the patterned radiation. Accordingly, to maintain the integrity of the patterned radiation, the photomask should be free from particles or contamination.

To reduce or prevent particles from being disposed on a photomask, a pellicle can be implemented to cover and protect the photomask from the particles or contaminates. Some particles or contaminates include particles present in any ambient atmosphere in which the photomask is disposed and particles or contaminates generated during a lithography process, such as chemical contamination (e.g., haze formation). To protect the photomask to prevent particles or contaminates from being disposed on the photomask while in a lithography chamber, the pellicle may be oriented in a manner that radiation of the lithography process will pass through the pellicle. Hence, the pellicle may be transparent to the wavelength of the radiation used in the lithography process. Further, a pellicle can be implemented on a photomask to prevent particles or contaminates from becoming disposed on the photomask when not in the lithography chamber, such as during transport and storage of the photomask. The pellicle can therefore be implemented to avoid or reduce cleaning of the photomask.

An example pellicle can be a thin pliable organic polymer film (supported by a rigid frame). In some example lithography processes, an organic polymer film may absorb a significant amount of radiation implemented by the lithography process, such as Extreme Ultra-Violet (EUV) radiation. Another example pellicle can be or include a rigid or hard pellicle, such as a thin polycrystalline or monocrystalline silicon substrate. Some rigid or hard pellicles may have sufficient transmissivity for a given lithography process and may not absorb a significant amount of radiation implemented by the lithography process.

Rigid or hard pellicles can have particulates break off or can experience a complete failure (e.g., breaking) through the course of being handled or transported and/or used during lithography processing. The pellicles can be handled when transferring the pellicles into or out of the lithography chamber and/or when photomasks are accessed. Handling the pellicles can cause the pellicles to contact other components, e.g., forcibly contact other components, which can cause particulates to break off of the pellicles or can cause a breaking of the pellicle. Further, thermal cycling of the pellicles as a result of absorption of radiation during the lithography processing can deteriorate the structural integrity of the pellicles, which can lead to further particulates breaking off of the pellicles.

Particulates breaking off of a pellicle and broken pieces of the pellicle can become disposed on the photomask. If these particulates or pieces are sufficient in size or amount, the particulates or pieces can adversely affect the transfer of the pattern of the photomask to the photoresist on the substrate. Some examples described herein provide for cleaning of the photomask by an etch process that can remove from the photomask any particulates or pieces that have broken off of the pellicle.

Generally, an etch process is implemented that selectively etches the particulates or pieces that broke off of the pellicle without significantly etching the photomask. As an example, the pellicle can be or include polycrystalline or monocrystalline silicon, and the photomask can include a fused silicon substrate and multiple layers of amorphous silicon and molybdenum. The etch process can be a wet etch process that selectively etches crystalline silicon (e.g., the particulates or pieces from the pellicle) without significantly etching the amorphous silicon (and other material) of the photomask. Additionally, if a material is additionally implemented in the pellicle (e.g., as a thermally conductive layer) that cannot be selectively etched in the etch process, a physical mechanism, such as vibrations, can be implemented in the etch process to remove portions of the particulates of that material.

Accordingly, some examples can implement a hard or rigid pellicle that has a high transmissivity during a lithography process. Further, a photomask used in the lithography process (that is protected by the pellicle) can be cleaned of particulates or pieces from the pellicle, which can avoid scrapping a photomask when a particulate or piece of the pellicle breaks off and becomes disposed on the photomask.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

FIG. 1 illustrates an example, simplified lithography chamber 10 according to some examples of the present disclosure. The lithography chamber 10 is described in the context of EUV lithography. However, other examples can implement other lithography techniques, such as immersion lithography. A person having ordinary skill in the art will readily understand various modifications to the lithography chamber 10 that may be made to implement another lithography technique.

The lithography chamber 10 includes walls that define an interior space 12. The interior space 12 is fluidly coupled to a vacuum system (e.g., including a vacuum pump 14) via a conduit 16 (e.g., a pipe or hose). The vacuum system is operable to maintain the interior space 12 at a target pressure during an EUV lithography process. The vacuum system may further include a gas source fluidly coupled to the interior space 12. The gas source can provide a gas, such as hydrogen ($H_2$), nitrogen ($N_2$), and/or argon (Ar), into the interior space 12, which the vacuum pump 14 can exhaust to purge the interior space 12. Such a purge can remove or reduce particles in the interior space 12.

One or more chamber doors 18 may be in one or more walls of the lithography chamber 10. The chamber door(s) 18 may open to permit the transfer of substrates (e.g., wafers), photomasks, and/or pellicles therethrough, such that such substrates, photomasks, and/or pellicles may be disposed in or removed from the interior space 12. When the chamber door(s) 18 are closed, a seal may be formed by the walls of the lithography chamber 10 such that the vacuum system may create a low pressure (e.g., vacuum) in the interior space 12.

A radiation source 20 is disposed in the interior space 12 of the lithography chamber 10. In the illustrated example, the radiation source 20 produces EUV radiation, which may have a wavelength of approximately 13.5 nm. Other examples can implement other radiation and radiation sources. The radiation source 20 is positioned such that the generated radiation is directed to optics.

The optics, in this simplified example, include a photomask 22 and a mirror 24. The optics are configured to reflect the radiation towards a substrate 26 on a substrate stage 28. Any number of mirrors may be implemented, as well as any configuration of the mirror(s) relative to the photomask 22, to cause the radiation from the radiation source 20 to be transmitted to the substrate 26 on the substrate stage 28. As illustrated, radiation 30 generated by the radiation source 20 is transmitted to and reflected off of the photomask 22. The radiation 30 reflected off of the photomask 22 carries a pattern corresponding to the pattern of the photomask 22. The radiation 30, from the photomask 22, is transmitted to and reflected off of the mirror 24. The radiation 30, from the mirror 24, is transmitted to and incident upon a photosensitive material (e.g., a photoresist) on the substrate 26 on the substrate stage 28. A person having ordinary skill in the art will readily understand that some loss of the radiation 30 may occur by absorption of energy by a reflection surface (e.g., the photomask 22 and/or mirror) and/or by absorption of photons in a gas in the interior space 12. In some examples, a low pressure (e.g., vacuum) in the interior space 12 can be implemented during the transmission of the radiation 30 to reduce absorption of photons by such gas. Optics for other lithography processes may differ, such as by including one or more lenses and/or by omitting mirrors, and by including any orientation of mirror(s) relative to the photomask 22 and radiation source 20.

Figure 2:
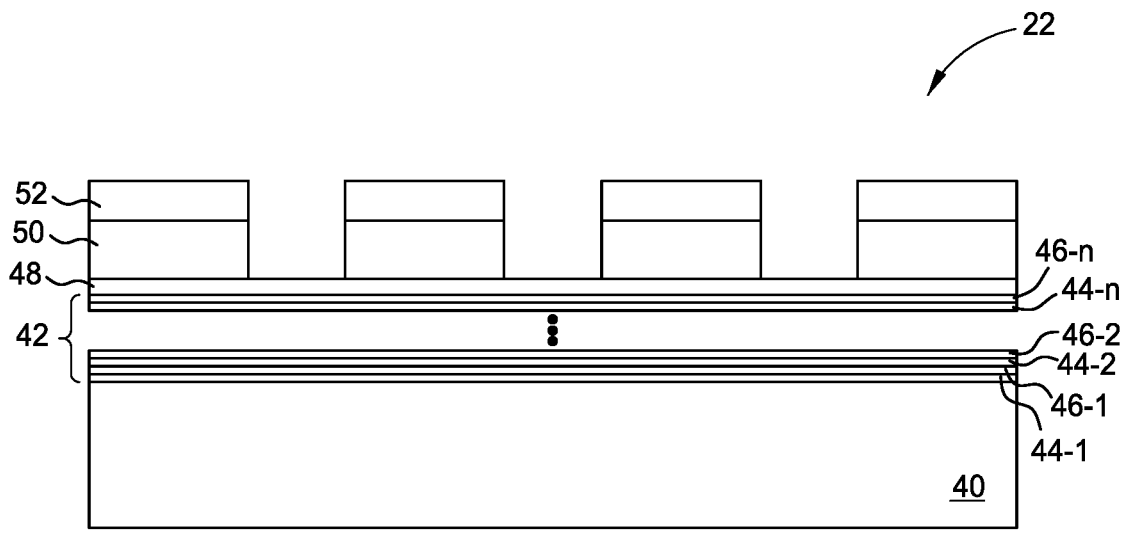
FIG. 2 is a cross-sectional view of an example photomask according to some examples of the present disclosure.

The photomask 22 can be any photomask appropriate for the photolithography process. In some examples, the photomask 22 is an EUV photomask. FIG. 2 illustrates a cross-sectional view of an example photomask 22 according to some examples. The photomask 22 of FIG. 2 includes a Bragg reflector 42 on a substrate 40. The substrate 40 may be a low thermal expansion material such as fused silica. The Bragg reflector 42 includes alternating layers of amorphous silicon ($\alpha$-Si) 44-1 through 44-$n$ and molybdenum (Mo) 46-1 through 46-$n$, such as 40 or more pairs of layers of amorphous silicon ($\alpha$-Si) and molybdenum (Mo). The photomask 22 further includes a capping layer 48 (e.g., ruthenium) on the Bragg reflector 42, a patterned absorber layer 50 (e.g., tantalum nitride, tantalum boron nitride, etc.) on the capping layer 48, and a patterned anti-reflection coating (ARC) 52 (e.g., an oxide) on the patterned absorber layer 50. In some examples, the photomask 22 is a binary intensity mask (BIM). In other examples, different photomasks can be implemented, such as a phase shift mask (PSM) (including an embedded attenuated PSM (EAPSM) and alternating aperture PSM (AAPSM)). Other photomasks may be implemented for different lithography processes.

The mirror 24 can be similar to the photomask 22 without an absorber layer and ARC. In some examples, the mirror 24 includes a Bragg reflector disposed on a substrate. The substrate may be a low thermal expansion material such as fused silica. The Bragg reflector comprises alternating layers of amorphous silicon ($\alpha$-Si) and molybdenum (Mo), such as 40 or more pairs of layers of amorphous silicon ($\alpha$-Si) and molybdenum (Mo). The mirror 24 can be flat or have a concave reflective surface. As stated previously, the mirror 24 can be omitted in other lithography processes, and lenses can be implemented in such lithography processes.

The substrate stage 28 is an electrostatic chuck with a stepper, for example. The substrate stage 28 is operable to receive a substrate 26 and to move (e.g., step) the substrate 26 such that different areas of the substrate 26 have the patterned radiation 30 incident thereon. The substrate stage 28 can include a thermal control system, such as pipes having a fluid flowing therethrough, to control a temperature of the substrate 26 on the substrate stage 28. The radiation 30 incident on the substrate 26 can increase a temperature of the substrate 26, and the thermal control system can be implemented to respond to such an increase in temperature of the substrate 26.

As indicated previously, particles and contamination present in the interior space 12 may become disposed on the photomask 22 if unprotected. Further, particles and contamination may become disposed on the photomask 22 during transport and handling of the photomask 22 to and away from the lithography chamber 10 or during storage of the photomask 22 when not in use in the lithography chamber 10. Particles and contamination on the photomask 22 may damage the photomask 22 and/or adversely affect transfer of the pattern of the photomask 22. Accordingly, a pellicle 32 is implemented on or proximate to the photomask 22. The pellicle 32 can be disposed on the photomask 22 or can be disposed such that a gap is between the pellicle 32 and the photomask 22. The pellicle 32, as illustrated, is supported by a support frame 34. The support frame 34 can secure the position of the pellicle 32 relative to the photomask 22. In some examples, a number of studs, such as four studs, are attached between the support frame 34 and the photomask 22 to secure the support frame 34 (and hence, the pellicle 32) in a position relative to the photomask 22 (e.g., with a gap between the photomask 22 and the pellicle 32). The pellicle 32 is disposed on or proximate to the surface of the photomask 22 on which the radiation 30 is incident and from which the radiation 30 is reflected. Hence, the pellicle 32 is positioned between the radiation source 20 and the photomask 22 and between the photomask 22 and the mirror 24. Accordingly, the radiation 30 is transmitted through the pellicle 32 during the lithography process.

In some examples, the pellicle 32 is or includes a material having sufficient structural integrity to retain the form of the material in the absence of an external force applied to the material. The material of the pellicle 32, in some examples, has a high transmissivity of the radiation 30, such as equal to or greater than about 80%. Further, the material of the pellicle 32 can be etched with a high selectivity relative to each material of the photomask 22, which will become more apparent subsequently. In a specific example, the pellicle 32 is polycrystalline silicon (p-Si), which has a transmissivity of EUV radiation of about 80% when the polycrystalline silicon has a thickness of 50 nm. In some examples, monocrystalline silicon (c-Si) can be implemented as the pellicle 32 with or without polycrystalline silicon (p-Si). The thickness of the material of the pellicle 32 (e.g., the thickness of the polycrystalline silicon (p-Si) in some examples) can be in a range from about 30 nm to about 50 nm.

Additionally, the pellicle 32 can further include a thermally conductive layer, which may dissipate thermal energy from the pellicle 32. Since the radiation 30 is transmitted through the pellicle 32, the pellicle 32 may absorb some radiation 30, which can increase the thermal energy in the pellicle 32. A thermally conductive layer can be implemented to conduct and dissipate the thermal energy from the pellicle 32. The thermally conductive layer can have a high emissivity to emit energy as thermal radiation. As an example, the thermally conductive material can be or include a metal, such as a layer of ruthenium. The thickness of the thermally conductive layer of the pellicle 32 can be in a range from about 3 nm to about 5 nm. A thermally conductive layer may be on one or both sides of the pellicle 32. For example, a thermally conductive layer can be on the side of the pellicle 32 proximate to the photomask 22 in the configuration of FIG. 1; a thermally conductive layer can be on the side of the pellicle 32 distal from the photomask 22; or respective thermally conductive layers can be on the sides of the pellicle 32 that are proximate to and distal from the photomask 22. In a specific example, the pellicle 32 includes polycrystalline silicon (p-Si) with one or more layers of a metal (e.g., ruthenium (Ru)) thereon.

Figure 3:
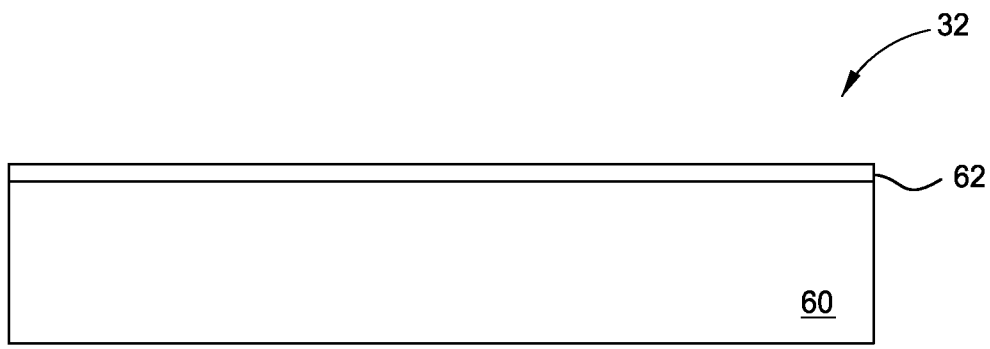
FIG. 3 is a cross-sectional view of an example pellicle according to some examples of the present disclosure.

FIG. 3 illustrates a cross-sectional view of an example pellicle 32 according to some examples. The pellicle 32 includes a rigid substrate 60 and an optional thermally conductive layer 62 on the rigid substrate 60. The optional thermally conductive layer 62 can be disposed on the side of the rigid substrate 60 that is proximate to the photomask 22 when disposed in the lithography chamber 10 of FIG. 1, or on the side of the rigid substrate 60 that is distal from the photomask 22 when disposed in the lithography chamber 10 of FIG. 1. In some examples, a thermally conductive layer can be on each of the distal and proximate sides of the rigid substrate 60 relative to the photomask 22. In a specific example, the rigid substrate 60 is polycrystalline silicon (p-Si), and the thermally conductive layer 62 is ruthenium (Ru).

During the course of using the photomask 22 and pellicle 32, the pellicle 32 may have particulates break off of the pellicle 32 and/or the pellicle 32 may break. For example, the pellicle 32 may be handled to attach and detach the pellicle 32 to and from, respectively, the photomask 22. Further, the pellicle 32 may be handled during transport of the pellicle 32 and photomask 22, including placing the pellicle 32 and photomask 22 in and/or removing the pellicle 32 and photomask 22 from the interior space 12 of the lithography chamber 10. Handling of the pellicle 32 can result in particulates breaking off of the pellicle 32 and/or in the pellicle 32 experiencing a complete failure (e.g., breaking), such as a result of contact between the support frame 34 and the pellicle 32, or between the pellicle 32 and another component. The particulates or pieces that break off of the pellicle 32 can become disposed on the photomask 22 (e.g., on the surface of the photomask 22 that reflects the radiation 30). Additionally, use of the pellicle 32 during lithography processing may cause particulates to break off of the pellicle 32. For example, thermal cycling of the pellicle 32 as a result of radiation 30 being transmitted therethrough can degrade the integrity of the pellicle 32, which can result in the particulates breaking off and becoming disposed on the photomask 22 or structural failure of the pellicle 32 resulting in particulates becoming deposited on the photomask 22.

Accordingly, in some examples, the photomask 22 undergoes an etch process to remove particulates and pieces created from the pellicle 32. The etch process can be any etch process that has a high selectivity between a material of the pellicle 32 (e.g., the particulates) and each material of the photomask 22. In some examples, the etch process is a wet etch process, although in other examples, a dry etch process can be implemented. In a wet etch process, the etch process can be or include a spin-on process or immersion process to introduce the etch solution to the photomask 22. In an example where the photomask 22 includes multiple layers of α-Si and Mo on a fused silica substrate and the pellicle 32 is p-Si, the etch solution in a wet etch process can be or include potassium hydroxide (KOH), tetramethylammonium hydroxide (TMAH), ethylenediamine pyrocatechol (EDP), or the like, any of which may further be diluted in deionized water (DIW). Solutions of KOH, TMAH, and EDP anisotropically etch crystalline planes of silicon at greater rates than amorphous silicon. Accordingly, solutions of KOH, TMAH, and/or EDP have a high etch selectivity between any p-Si particulates or pieces from the pellicle 32 on the photomask 22 and the α-Si and fused silica (among other materials) of the photomask 22. The p-Si particulates or pieces from the pellicle 32 can therefore be etched and removed from the photomask 22 by the etch process. Regardless of the etch process implemented, the etchant that is used has a low etch rate of each material of the photomask 22 (e.g., absorber layer, capping layer, etc.) and a higher etch rate of a material of the pellicle 32 to remove particulates or pieces of the pellicle 32 from the photomask 22 without damaging the photomask 22.

In some examples, the pellicle 32 may further include a layer of a material, such as the thermally conductive layer, that is a same material as a material of the photomask 22 and/or that cannot be selectively etched by the etchant. As an example, if ruthenium is implemented on p-Si as the pellicle 32 and ruthenium is also implemented as the capping layer on the photomask 22, the etch process should not etch ruthenium since doing so can damage the capping layer of the photomask 22. Accordingly, a physical mechanism can be implemented to remove any particulates or pieces from the pellicle 32 that are not etched by the etchant during the etch process. An example of a physical mechanism includes vibration, e.g., megasonic vibration, of the etch solution and/or the photomask 22 during the etch process. In a wet etch process (e.g., using a spin-on process), a nozzle that sprays the etch solution can be vibrated while the etch solution is applied to the photomask 22. The etch solution etches the portions of the particulates on the photomask 22 that the etch solution is selective to etch, as described above. The portions of the particulates or pieces on the photomask 22 that the etch solution does not etch are dislodged from the surface of the photomask 22 by the vibrations and are caused to remain suspended in the etch solution by the vibrations. As the etch solution flows from the surface of the photomask 22, the suspended portions of the un-etched particulates or pieces are removed from the photomask 22. The photomask 22 can be vibrated alternatively or in addition to vibrating a nozzle, for example.

Figure 4:
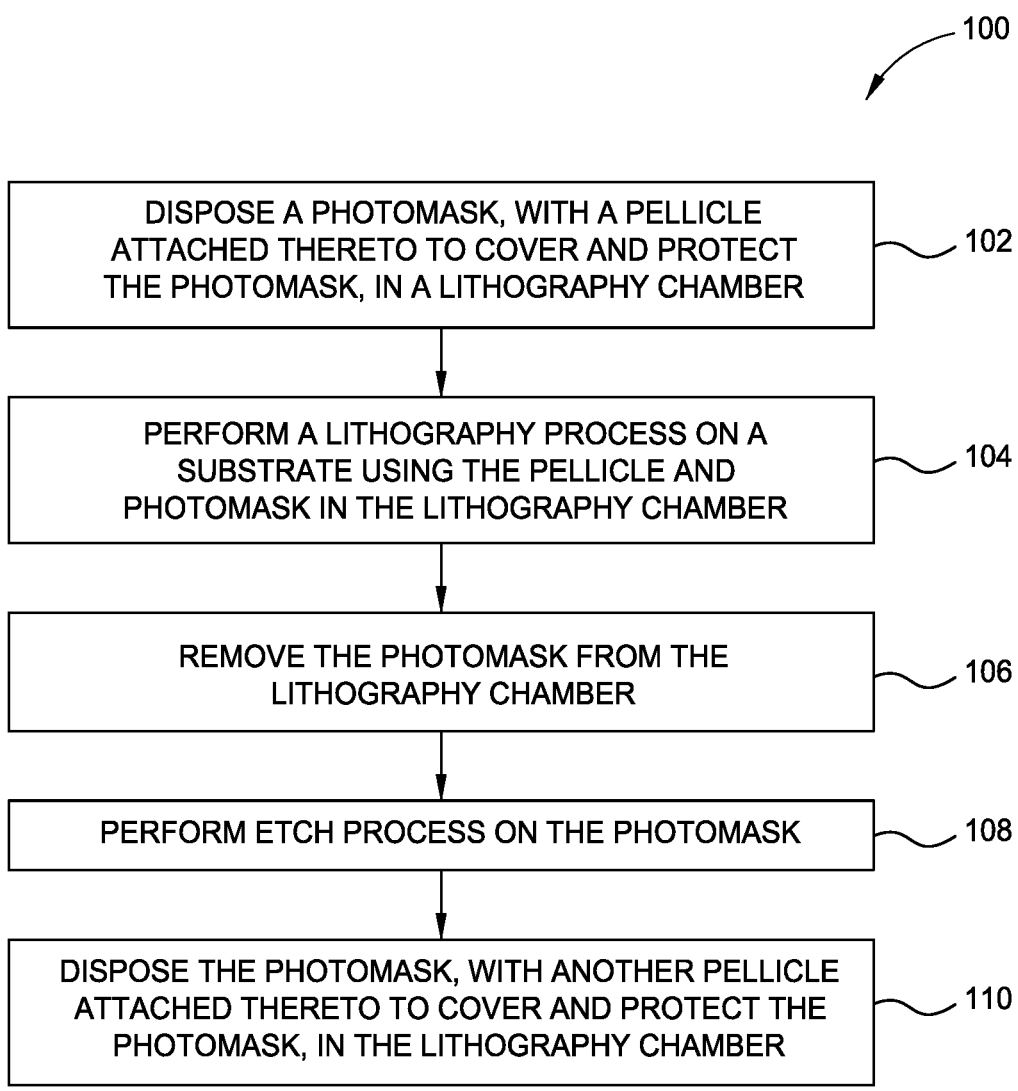
FIG. 4 is a method for photomask processing according to some examples of the present disclosure.

FIG. 4 is a method 100 for photomask processing according to some examples of the present disclosure. In operation 102, a photomask is disposed in a lithography chamber. A pellicle is attached to the photomask, e.g., attached before disposing the photomask in the lithography chamber, so that the pellicle covers and protects the photomask. In the context of FIG. 1, the photomask 22 is disposed in the lithography chamber 10, and the pellicle 32 is attached to and covers and protects the photomask 22. The pellicle 32 and photomask 22 may each be transferred into the interior space 12 of the lithography chamber 10 through the chamber door 18 by an automated transfer robot and/or by a person manually placing the pellicle 32 and photomask 22. The pellicle 32 and photomask 22 may be implemented as described above with respect to preceding figures.

In operation 104, a lithography process is performed on a substrate using the pellicle and photomask in the lithography chamber. In the context of FIG. 1, the substrate 26 is transferred into the lithography chamber 10 through the chamber door 18 using, e.g., a transfer robot, and is received at the substrate stage 28. The radiation source 20 generates and transmits radiation 30, which is incident on and reflected off of the photomask 22 (and transmitted through the pellicle 32) to obtain a patterned radiation 30. The patterned radiation 30 is further incident on and reflected off of the mirror 24 (and any other mirror) and is then incident on the substrate 26 (e.g., on a photoresist on the substrate 26). The substrate stage 28 can step the substrate 26 such that patterned radiation 30 is incident on different areas of the substrate 26. Once the various areas of the substrate 26 are exposed to patterned radiation 30, the substrate 26 is transferred out of the lithography chamber 10 using, e.g., the transfer robot. The lithography process can implement EUV lithography as the lithography process; although other lithography processes can be implemented. Operation 104 can be repeated on any number of substrates.

In operation 106, the photomask is removed from the lithography chamber. In the context of FIG. 1, the photomask 22 and pellicle 32 are removed from the interior space 12 of the lithography chamber 10 through the chamber door 18 by an automated transfer robot and/or by a person manually removing the photomask 22 and pellicle 32. A visual or automated inspection of the photomask 22 may be implemented to determine when the photomask 22 should to be removed for performance of subsequent operations (e.g., when particulates are present on the photomask 22), which may or may not require the removal of the pellicle 32 from being attached to the photomask 22. Additionally, a predetermined number of performances of the lithography process of operation 104 may be performed and/or a predetermined amount of time may pass to determine when the photomask 22 should to be removed for performance of subsequent operations.

The operations 102, 104, and 106 can be performed any number of times, which can further include transport, handling, and storage of the photomask with the pellicle attached thereto. During any of the operations 102, 104, and 106, transport, handling, and storage of the photomask and pellicle, particulates or pieces can break off of the pellicle and become disposed on the photomask, as described above. Also, at any instant of such operations 102, 104, and 106, transport, handling, and storage, the pellicle can break, and pieces of the pellicle can become disposed on the photomask. Further, even with the pellicle acting as a protective cover, other particulates and contaminates, e.g., from an ambient environment and from chemical contamination resulting from a lithography process, can be disposed on the photomask. Hence, a subsequent operation can be performed to clean the photomask.

In operation 108, an etch process is performed on the photomask. First, the photomask is obtained, for example, by removing the photomask from the lithography chamber in which the photomask is disposed in operation 106 or by receiving the photomask from a third party. The pellicle (including any frame) can then be detached and removed from the photomask. Particulates and larger pieces broken from the pellicle can remain disposed on the photomask after the pellicle and frame are removed from the photomask. The photomask can be transferred to an etching chamber where the etch process is performed. The etch process can be as described previously to remove particulates and pieces from the photomask that may have broken off of the pellicle and to remove any other particles or contamination. After the etch process of operation 108 to clean the photomask, the photomask can be inspected and requalified before being deployed back to a lithography chamber for lithography processing. In some examples, operation 108 can occur at a specialized photomask cleaning shop separate from the fab in which the lithography process of operation 104 is performed.

In operation 110, the photomask is disposed back in the lithography chamber, with another pellicle attached thereto to cover and protect the photomask. The photomask is disposed as described above with respect to operation 102. The photomask, with or without the pellicle attached thereto, may be transported, handled, and/or stored following operation 108 and before operation 110. Subsequently, operations 104, 106, 108, and 110 may be repeated any number of times.

Figure 5:
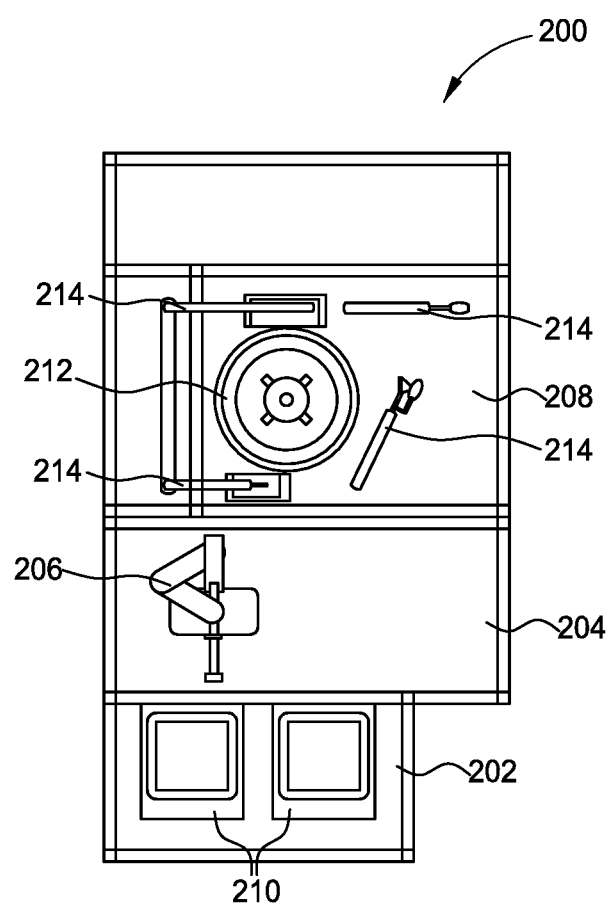
FIG. 5 is a top view showing an illustrative processing system according to some examples of the present disclosure.

FIG. 5 is a top view showing an illustrative processing system 200 according to some examples of the present disclosure. The processing system 200 of FIG. 5 can implement operation 108 of the method 100 of FIG. 4. The processing system 200 includes a loading port 202, a transfer chamber 204, a transfer (e.g., tool and material handling) robot 206 within the transfer chamber 204, and a wet processing chamber 208. The wet processing chamber 208 is an etching chamber for cleaning the photomask as described above. Other processing chambers may be included in the processing system 200, such as additional wet processing chambers, an inductively coupled plasma processing chamber, a cold plate chamber, and/or another chamber.

The loading port 202, as illustrated, is configured to receive two Standard Mechanical Interface (SMIF) pods 210, although other examples can be configured to receive more or fewer. The SMIF pods 210 can contain and support one or more photomasks during transport to and from the processing system 200. A pod opener (not illustrated) can remove a door from the SMIF pod 210, which further provides an opening between the transfer chamber 204 and the SMIF pod 210 in the loading port 202.

The transfer robot 206 is positioned and configured to be capable of inserting one or more tools (e.g., substrate handling blades) through each opening between the transfer chamber 204 and the SMIF pod 210 in the loading port 202. That is, the transfer robot can insert tools into each SMIF pod 210 via a respective opening between the transfer chamber 204 and the loading port 202. The transfer robot 206 is further configured to be capable of inserting one or more tools through a door (not illustrated) between the transfer chamber 204 and the wet processing chamber 208. The transfer robot 206 is therefore capable of transferring a photomask from a SMIF pod 210 to the wet processing chamber 208 for processing. If other processing chambers are implemented in the processing system 200, the transfer robot 206 can further be capable of transferring photomasks between the loading port 202 and any processing chamber and/or between any processing chambers.

The wet processing chamber 208 includes a chuck 212. The chuck 212 is configured to receive (e.g., from the transfer robot 206) and support a photomask for processing in the wet processing chamber 208. The chuck 212 can further be configured to rotate and/or provide vibrations to a photomask thereon. The wet processing chamber 208 further includes one or more (e.g., four) swing arms 214. Each swing arm 214 is configured to be rotatable (e.g., swing) around a pivot point, and each swing arm 214 has a nozzle on the respective swing arm 214 distal from the pivot point. The nozzle is configured to dispense a liquid during wet processing in the wet processing chamber 208. The nozzles can be sweep nozzles, sonic vibration nozzles, the like, or a combination thereof. During wet processing, the chuck 212 rotates with a photomask thereon. One or more of the swing arms 214 can rotate to direct a dispensed fluid (e.g., an etching solution) from the respective nozzle to the photomask, while the chuck 212 rotates. One or more of the swing arms 214 can be implemented to dispense any fluid in any combination or sequence.

The processing system 200 includes one or more process controllers (not shown), each of which may be or include a computer or system of computers. Each process controller can include a processor that executes program code instructions stored on a tangible, non-transitory medium, such as random access memory (RAM), read-only memory (ROM), etc., to perform and/or control various operations described herein. The process controller (or a respective process controller) can control operations of the loading port 202 (e.g., the pod opener), the transfer robot 206, and/or the wet processing chamber 208. If multiple process controllers are implemented, the process controllers may each be in communication with one or more of the other process controllers to coordinate various operations.

An example is a method for photomask processing. The method can include: obtaining a photomask that is protected by a pellicle during a photolithography process. The method can also include cleaning the photomask by performing an etch process on the photomask using an etchant that is selective to etch a first material of the pellicle at a greater rate than each material of the photomask.

In such a method, the first material of the pellicle can have a structural integrity to retain a form of the first material of the pellicle in the absence of an external force applied to the first material of the pellicle.

In such a method, the first material of the pellicle can be polycrystalline silicon; and the photomask can include one or more layers of amorphous silicon. In such a method, the etchant can selectively etch a crystalline plane of silicon. In such a method, the etchant can include potassium hydroxide (koh), tetramethylammonium hydroxide (tmah), ethylenediamine pyrocatechol (edp), or a combination thereof.

In such a method, the etch process can be a wet etch process.

In such a method, the pellicle can include a thermally conductive layer on the first material of the pellicle, the thermally conductive layer being a second material of the pellicle. In such a method, the etchant may not selectively etch the second material of the pellicle.

In such a method, the etch process can include vibrating the photomask, the etchant, or a combination thereof.

In such a method, the photomask can be an extreme ultra-violet (EUV) photomask, and the pellicle can be an EUV pellicle.

In such a method, the method can include removing at least a portion of the pellicle from the photomask while leaving behind one or more broken pieces of the pellicle. In such a method, cleaning the photomask can include removing the broken pieces of the pellicle from the photomask using the etchant.

Another example is a method of photomask processing, the method can include: obtaining a photomask that is protected by a pellicle during a photolithography process, the pellicle including a rigid material through which radiation is transmitted during the photolithography process. The method of photomask processing also can include exposing the photomask to an etchant, the etchant being selective to etch the rigid material of the pellicle at a greater rate than each material of the photomask.

In such a method, the rigid material of the pellicle can be polycrystalline silicon, and the photomask may include one or more layers of amorphous silicon. In such a method, the etchant can selectively etch a crystalline plane of silicon.

In such a method, the pellicle can include a thermally conductive material on the rigid material of the pellicle.

A further example is a method of photomask processing. The method can include: exposing a photomask to a wet etchant, where: the photomask is used during a photolithography process, the photomask being protected by a pellicle during the photolithography process; the photomask including one or more layers of amorphous silicon; the pellicle including polycrystalline silicon through which radiation is transmitted during the photolithography process; and the wet etchant selectively etches a crystalline plane of silicon.

In such a method, the wet etchant can include potassium hydroxide (koh), tetramethylammonium hydroxide (tmah), ethylenediamine pyrocatechol (edp), or a combination thereof.

In such a method, the pellicle can further include a thermally conductive metal layer on the polycrystalline silicon. In such a method, the wet etchant may not selectively etch the thermally conductive metal layer.

In such a method, exposing the photomask to the wet etchant can include vibrating the photomask, the wet etchant, or a combination thereof.

While the foregoing is directed to various examples of the present disclosure, other and further examples may be devised without departing from the basic scope thereof, and the scope thereof is determined by the claims that follow.

The invention claimed is:

1. A method for photomask processing, comprising:
    disposing a photomask protected by a pellicle into a chamber; and
    cleaning the photomask by performing an etch process on the photomask using an etchant that is selective to etch a first material of the pellicle at a greater rate than each material of the photomask, wherein:
        the first material of the pellicle comprises polycrystalline silicon;
        the photomask comprises one or more layers of amorphous silicon;
        the etchant comprises tetramethylammonium hydroxide, ethylenediamine pyrocatechol, or a combination thereof; and
        the etch process includes vibrating the photomask, the etchant, or a combination thereof.

2. The method of claim 1, wherein the first material of the pellicle has a structural integrity to retain a form of the first material of the pellicle in the absence of an external force applied to the first material of the pellicle.

3. The method of claim 1, wherein the etchant selectively etches a crystalline plane of silicon.

4. The method of claim 1, wherein the etch process is a wet etch process.

5. The method of claim 1, wherein the pellicle includes a thermally conductive layer on the first material of the pellicle, the thermally conductive layer being a second material of the pellicle.

6. The method of claim 5, wherein the etchant does not selectively etch the second material of the pellicle.

7. The method of claim 1, further comprising:
    removing at least a portion of the pellicle from the photomask while leaving behind one or more broken pieces of the pellicle, and wherein cleaning the photomask further comprises removing the broken pieces of the pellicle from the photomask using the etchant.

8. A method of photomask processing, comprising:
    disposing a photomask protected by a pellicle into a chamber, the pellicle comprising a rigid material through which radiation is transmitted during a photolithography process; and
    exposing the photomask to an etchant during an etch process, the etchant being selective to etch the rigid material of the pellicle at a greater rate than each material of the photomask, wherein:
        the rigid material of the pellicle comprises polycrystalline silicon;
        the photomask comprises one or more layers of amorphous silicon;
        the etchant comprises tetramethylammonium hydroxide, ethylenediamine pyrocatechol, or a combination thereof; and the etch process includes vibrating the photomask, the etchant, or a combination thereof.

9. The method of claim 8, wherein the etchant selectively etches a crystalline plane of silicon.

10. The method of claim 8, wherein the pellicle includes a thermally conductive material on the rigid material of the pellicle.

11. A method of photomask processing, comprising:
    exposing a photomask to a wet etchant during an etch process, wherein:
        the photomask is used during a photolithography process, the photomask being protected by a pellicle during the photolithography process;
        the photomask comprising one or more layers of amorphous silicon;
        the pellicle comprising polycrystalline silicon through which radiation is transmitted during the photolithography process;
        the wet etchant selectively etches a crystalline plane of silicon;
        the wet etchant comprises tetramethylammonium hydroxide, ethylenediamine pyrocatechol, or a combination thereof; and
        the etch process includes vibrating the photomask, the wet etchant, or a combination thereof.

12. The method of claim 1, wherein the photomask includes a fused silicon substrate and multiple layers of amorphous silicon and molybdenum.

13. The method of claim 12, wherein the pellicle further comprises a thermally conductive layer disposed on the polycrystalline silicon, and wherein the thermally conductive layer comprises ruthenium.

14. The method of claim 13, wherein the etch process selectively etches the polycrystalline silicon of the pellicle over the amorphous silicon of the photomask.

15. The method of claim 8, wherein the photomask includes a fused silicon substrate and multiple layers of amorphous silicon and molybdenum.

16. The method of claim 15, wherein the pellicle further comprises a thermally conductive layer disposed on the polycrystalline silicon, and wherein the thermally conductive layer comprises ruthenium.

17. The method of claim 16, wherein the etch process is a wet etch process that selectively etches the polycrystalline silicon of the pellicle over the amorphous silicon of the photomask.

18. The method of claim 11, wherein the photomask includes a fused silicon substrate and multiple layers of amorphous silicon and molybdenum.

19. The method of claim 18, wherein the pellicle further comprises a thermally conductive layer disposed on the polycrystalline silicon, and wherein the thermally conductive layer comprises ruthenium.

20. The method of claim 19, wherein the etch process selectively etches the polycrystalline silicon of the pellicle over the amorphous silicon of the photomask.

* * * * *